US006910264B2

United States Patent
Tung (10) Patent No.: US 6,910,264 B2
(45) Date of Patent: Jun. 28, 2005

(54) METHOD FOR MAKING A MULTILAYER CIRCUIT BOARD HAVING EMBEDDED PASSIVE COMPONENTS

(75) Inventor: I-Chung Tung, Hsinchu (TW)

(73) Assignee: Phoenix Precision Technology Corp. (TW)

( * ) Notice: Subject to any disclaimer, the term of this patent is extended or adjusted under 35 U.S.C. 154(b) by 216 days.

(21) Appl. No.: 10/336,189

(22) Filed: Jan. 3, 2003

(65) Prior Publication Data

US 2004/0128822 A1 Jul. 8, 2004

(51) Int. Cl.[7] ................................................. H05K 3/36
(52) U.S. Cl. ........................... 29/830; 29/825; 29/832; 29/840; 29/852
(58) Field of Search .......................... 29/825, 830, 832, 29/840, 852, 620, 846, 848, 25.42

(56) References Cited

U.S. PATENT DOCUMENTS

| | | | | |
|---|---|---|---|---|
| 4,870,746 A | * | 10/1989 | Klaser | .......................... 29/620 |
| 5,708,569 A | * | 1/1998 | Howard et al. | .............. 361/760 |
| 5,800,575 A | * | 9/1998 | Lucas | ......................... 29/25.42 |
| 6,610,417 B2 | * | 8/2003 | Andresakis et al. | ......... 428/607 |
| 6,631,551 B1 | * | 10/2003 | Bowles et al. | ................. 29/620 |
| 6,734,542 B2 | * | 5/2004 | Nakatani et al. | ............. 257/687 |

* cited by examiner

Primary Examiner—Carl J. Arbes (57) ABSTRACT

A method for fabricating a core circuit board having passive components, such as resistors, capacitors and inductors, is disclosed, which can be used to construct a multilayer circuit board having embedded passive components. In making such as a core circuit board, a resistive film which is a continuous or non-continuous is first formed on one side of a conductive foil. Two such conductive foils are laminated onto a high dielectric layer. The electrodes for various passive components or spiral coils for the inductive components and electrical circuit pattern are finally made on the same conductive foils simultaneously. Finally, a core circuit board having passive components for further making a multilayer circuit board is thus constructed.

22 Claims, 9 Drawing Sheets

METHOD FOR MAKING A MULTILAYER CIRCUIT BOARD HAVING EMBEDDED PASSIVE COMPONENTS

BACKGROUND OF THE INVENTION (a) Field of the Invention

The present invention relates to a method for fabricating a core circuit board having passive components, such as resistors, capacitors and inductors, which can be used to construct a multilayer circuit board with embedded passive components.

(b) Description of the Prior Art

With an increasing tendency towards high performance and compact size, a circuit board is required to have a high degree of lamination and high density of circuitry. In order further to minimize the space requirements on circuit boards, implementation of the embedded passive components, such as resistors, capacitors, and inductors, in a multiplayer circuit have been developed.

Integrating a variety of passive components in a multiplayer circuit board can be accomplished in a number of ways. For instance, for thick-film resistor materials, such as a dispersion of silver powder or carbon particles in a resin or a dispersion of $RuO_2$ and glass powders in a binder, the thick-film resistors can be made by the screen printing or roller coating method. In contrast, for thin-film resistor materials, such as Ni—Cr, Ni—P, Ni—Sn, Cr—Si, and TaN alloys, etc., the thin-film resistors can be formed by the sputtering, electroplating or electroless plating method. The selection of thick-film resistors or thin-film resistors to be used in making a multilayer circuit board is a trade-off of cost and fine component resolution.

A number of thick-film or thin-film materials for making passive components are well recognized. Currently, the critical issue is how to integrate the existing thick-film or thin-film passive components into the circuit board, which must be easily adaptable to the manufacturing process of a multilayer circuit board. Most of the methods in this field, such as those provided by U.S. Pat. Nos. 3,857,683, 5,243,320, and 5,683,928, made the thick film or the thin film passive components on the surface of the insulating layer by the screen printing and/or photoresist-etching method before stacking a new circuit layer in the process of manufacturing a multilayer circuit board. In the present time, however, only two types of embedded passives are commercially available for industrial mass production. One type is electroplated planar resistive material which is disclosed in U.S. Pat. No. 5,243,320. The other type is internal capacitive laminate which is disclosed is U.S. Pat. No. 5,870,274. However, the embedded capacitors and resistors attached to the same circuit layer have never been achieved in the prior art, which can be accomplished by the method proposed herein of combining the advantages of the fabrication processes which have been taught in the U.S. Pat. Nos. 5,343,320 and 5,870,274.

Accordingly, it is desirable to provide a method for fabricating the embedded capacitors and resistors attached to the same circuit layer in a multilayer circuit board, which is very preferable for achieving a high density multilayer circuit board.

SUMMARY OF THE INVENTION

It is therefore an objective of the present invention to provide a technically feasible method of making a multilayer circuit board having embedded passive components, which beneficially simplifies the process of embedding the passive components in a multilayer circuit board, and which particularly presents high reliability.

Another objective of the present invention is the provision of the conductive foil with a continuous or non-continuous resistive film on its one side. Two such conductive foils are laminated to a high dielectric layer. After etching process, the circuit pattern and the electrodes for the passive components are finally formed on the same conductive foils at the same time, which forms a two-layer core circuit board.

A further objective of the present invention is the provision of the first conductive foil with a continuous or non-continuous resistive film on its one side. Said first conductive foil containing at least one resistive film and a second conductive foil are laminated to a high dielectric layer. After etching process, the circuit pattern and electrodes for the passive components are finally formed on the same conductive foils at the same time, which forms a two layer core circuit board.

A further objective of the present invention is the provision of a core board, which is comprised of a high dielectric layer covered with two electrically conductive foils on its both sides, and at least one of said two conductive foils containing resistive film on said foil surface. After etching process, the circuit pattern and electrodes for the passive components are finally formed on the same conductive foils at the same time, which forms a two-layer core circuit board.

A further objective of this invention is to adopt a process of making a core circuit board which possesses at least two capacitors, in which an insulating material and/or an electrically conductive material are deposited in between said capacitors in said high dielectric constant layer.

DETAILED DESCRIPTION OF THE PRESENT INVENTION

For a better understanding on the advantages and capabilities of the present invention, reference is made to the following disclosure, appended claims in connection with the accompanying drawings. It will be obvious to one skilled in the art that the principle feature of the invention may be employed in various embodiments without departing from the scope of the invention.

The invention provides a method to manufacture a high density multilayer circuit board in which embedded capacitive and resistive components are attached to the same circuit layer. In the method, a high dielectric layer is used as an adhesive to further stack two conductive foils which already carry resistive material. Such said high dielectric layer combined with the conductive foils carrying resistive material then introduced into the multilayer circuit board lamination process. After lamination, the circuit pattern and electrodes for the passive components are finally formed on the same conductive foils at the same time, which forms a two-layer core circuit board. Subsequently, said resulting two-layer core circuit board can be used for making a multilayer circuit board, which beneficially simplifies the process of embedding the passive components in a multilayer circuit board with high reliability.

Figure 1A:
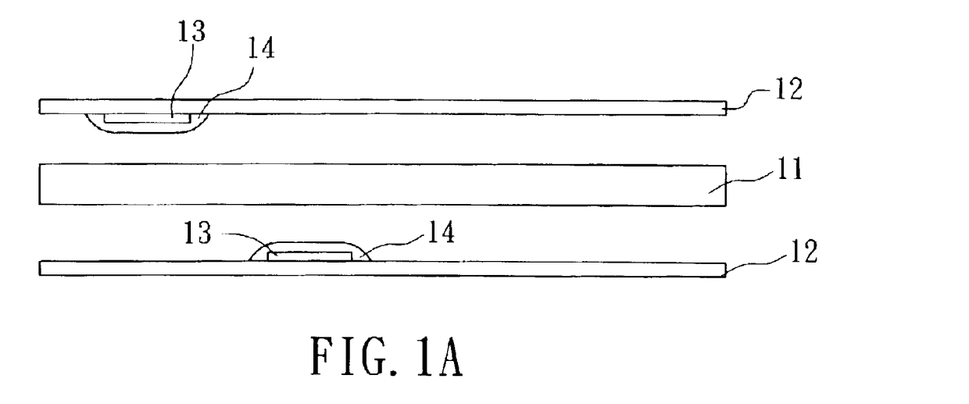
FIG. 1A to FIG. 1C show the process of forming capacitors and resistors in a core circuit board in accordance with the first preferred embodiment of the present invention.
Figure 1B:
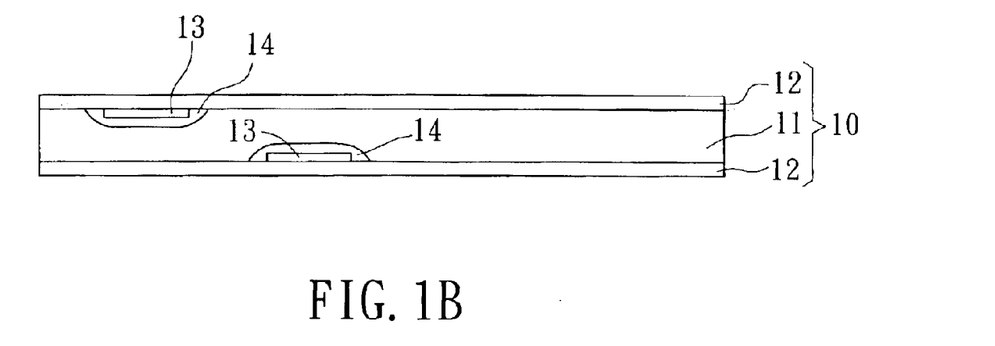
Figure 1C:
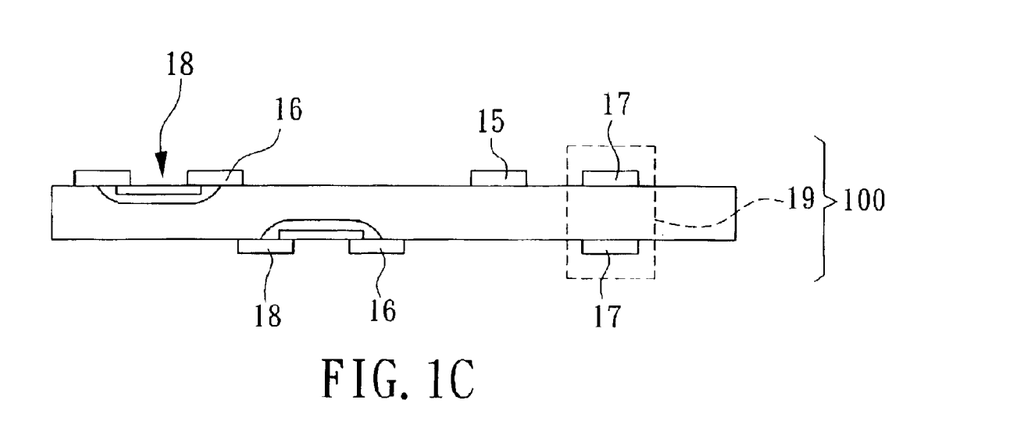

Now referring to FIG. 1, in accordance with a preferred embodiment of the present inventive process to form capacitors and resistors in a core circuit board, there is initially provided a high dielectric layer 11 with a dielectric constant larger than 4.0, which may be composed of polymeric material, ceramic material, or ceramic powder filled polymer and the like. Two conductive foils 12, e.g. made of copper, aluminum, silver, platinum, palladium, silver-palladium, or metal-filled polymeric material etc., have the flat or slightly roughened surface on its double sides, and a resistive film 13 is deposited on each of said foils 12 and may be hardened in place by heating if necessary. A protective coating 14, which may be an insulative resin or ceramic material, such as epoxy resin, polyimide, bismeleimide triazine, cyanate ester, aluminum oxide, glass and the like, is dispensed and covers said resistive film 13. Said protective coating 14 may be made by sputtering, printing or roller coating etc., which has been well recognized in the art. If said protective coating 14 is made of resin, said protective coating 14 is preferably partially crosslinked before the lamination process to obtain better adhesion on said high dielectric layer 11. Said conductive foils 12 containing said resistive films 13 may be further surface roughened chemically or physically to enhance adhesion property, which has been a well-known technique in the art. Subsequently, said foils 12 carrying said resistive films 13 are laminated onto the both sides of said high dielectric layer 11 to form a core board 10, as shown in FIG. 1B. The alignment during this lamination step can be critical to success of the method. Through etching process, the circuit pattern 15 and the electrodes 16,17 for resistors 18 and capacitors 19 respectively are defined on said core board 10, as FIG. 1C illustrates. Thus the formation of the resistor components 18 and the capacitor components 19 on said core circuit board 100 is thus accomplished.

Said electrical resistive film 13 may be made by electroplating, electroless platting, sputtering, roller coating or printing, etc. For instance, said resistive film 13 made of Ni—Cr, Ni—Sn, Ni—P, Cr—Si or Ta—N alloy etc. can be electrodeposited or sputter-deposited, while carbon paste, silver paste, or $RuO_2$-glass paste can be deposited by the printing methods. However, the above printed film should be hardened by curing (for carbon or Ag paste) or firing (for $RuO_2$- glass paste) in an ambient or insert atmosphere before the deposited of said protective coating 14.

Figure 2A:
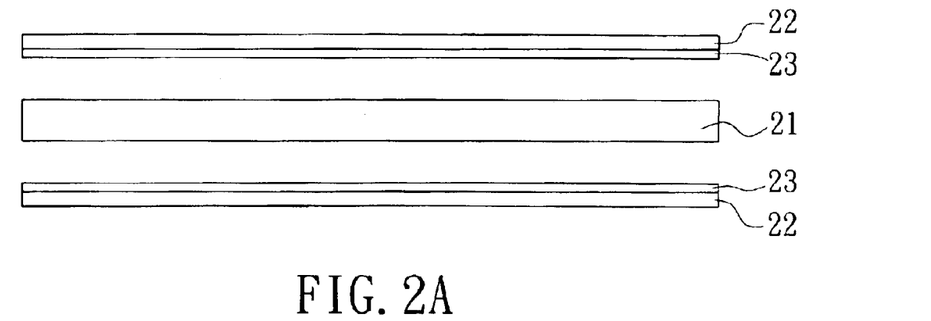
FIG. 2A to FIG. 2B show the process of forming capacitors and resistors in a core circuit board in accordance with the second preferred embodiment of the present invention.
Figure 2B:
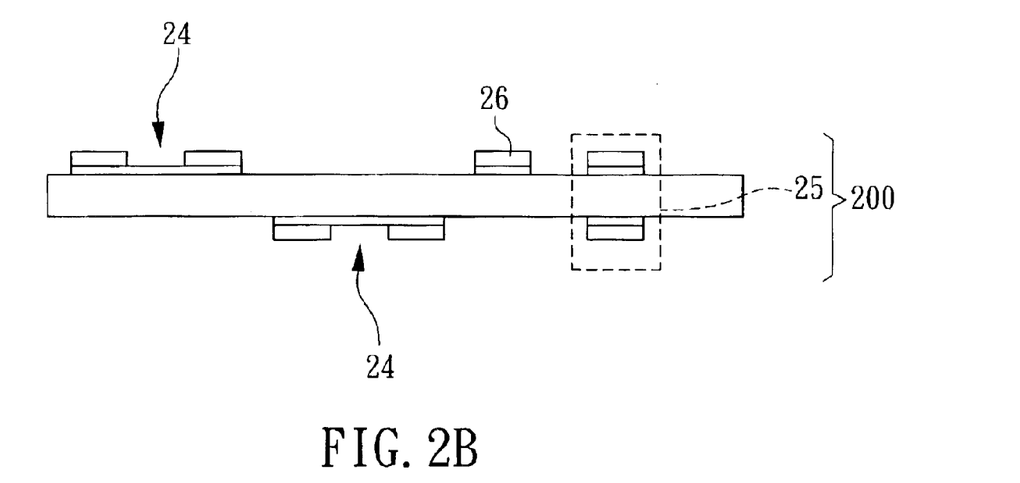

In accordance with a preferred embodiment of the present invention, the conductive foils 22 can also carry a continuous or partially continuous metal resistive film 23, as shown in FIG. 2A. With etching process, the core circuit board 200 which possesses the circuit pattern 26, resistors 24, and capacitors 25 can thus be constructed, as shown in FIG. 2B. The detailed etching methods used in said etching process can be readily be referred to U.S. Pat. No. 5,243,320.

In accordance with a preferred embodiment of the present invention, the spiral coils not shown in the FIGS. 1B and 2B, acting as inductors, which may be a pattern of circular, elliptical, rectangular, polygonal spiral, or other type of configuration, and circuit pattern 15 or 26 can also be easily made on said same conductive foils 12 (or 22) at the same time.

Figure 3A:
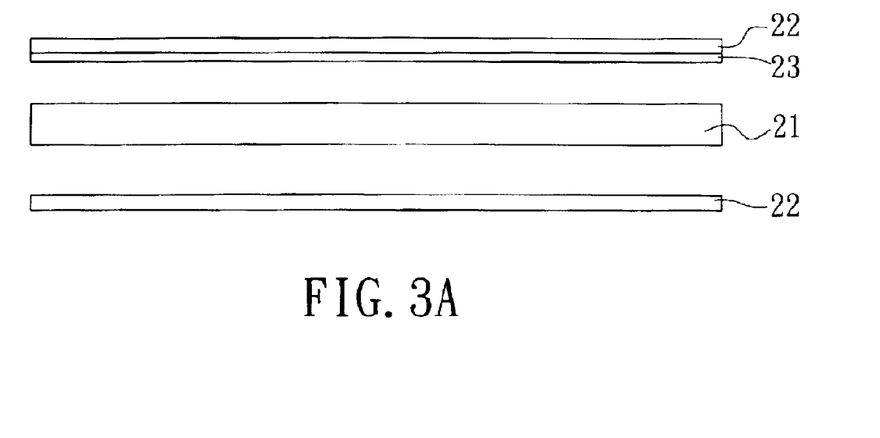
FIG. 3A to FIG. 3B show the process of forming capacitors and resistors in a core circuit board in accordance with the third preferred embodiment of the present invention.
Figure 3B:
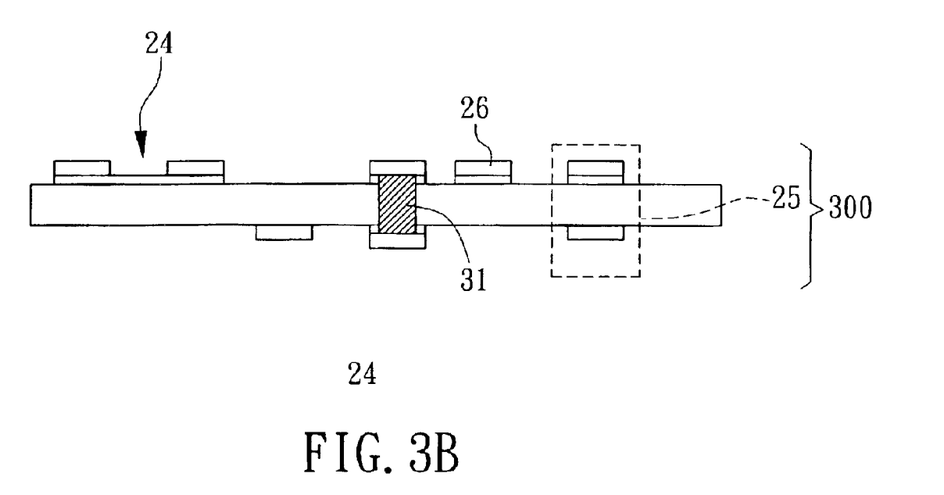

In accordance with a preferred embodiment of the present invention, it is not restricted that all conductive foils 12 (or 22) should carry resistive films. But only one of said conductive foils 12 (or 22) carrying resistive film is also applicable to this inventive process to make a core circuit board having embedded passive components. As can be seen in FIG. 3A, said conductive foils 22 in which only one of said conductive foils 22 containing a continuous resistive film 23 are laminated to said high dielectric layer 21 to form a core circuit board 300. Following etching process, as illustrated in FIG. 3B, the resistors 24 and capacitors 25 are presented on the resulting core circuit board 300 and plated through hole 31 is also intentionally formed to interconnect two circuit layers of said core circuit board 300.

Figure 4:
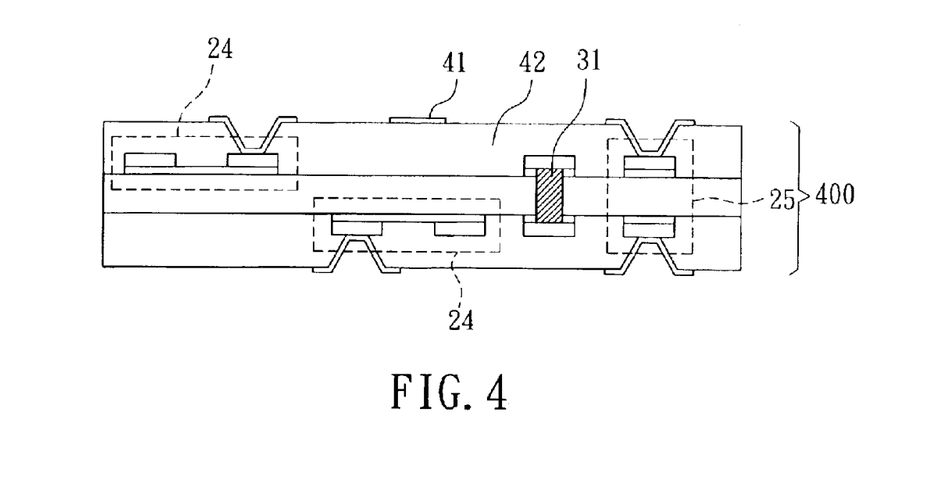
FIG. 4 shows the capacitors and resistors in a multilayer circuit board in accordance with the fourth preferred embodiment of the present invention.
Figure 5:
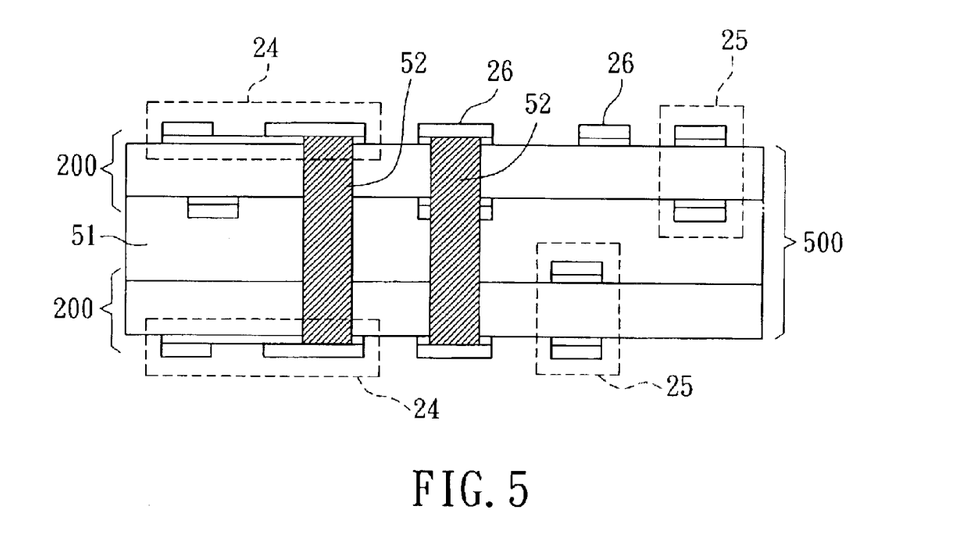
FIG. 5 shows the capacitors and resistors in a multilayer circuit board in accordance with the fifth preferred embodiment of the present invention.

In accordance with a preferred embodiment of the present invention, the resulting core circuit board 100, 200 or 300 can be further used for constructing a multilayer circuit board by the lamination or build-up process. Illustrated in FIG. 4 is a typical example, which is a four-layer circuit board with embedded passive components. In the figure, it can be seen that the extra circuit layer 41 is formed on the insulating layer 42. The other typical example is shown in FIG. 5, in which two core circuit boards 200 are laminated to an insulating layer 51 to form a four-layer circuit board 500. The plated through holes 52 are also intentionally formed to electrically interconnect the circuit layers of said four-layer circuit board 500.

Figure 6A:
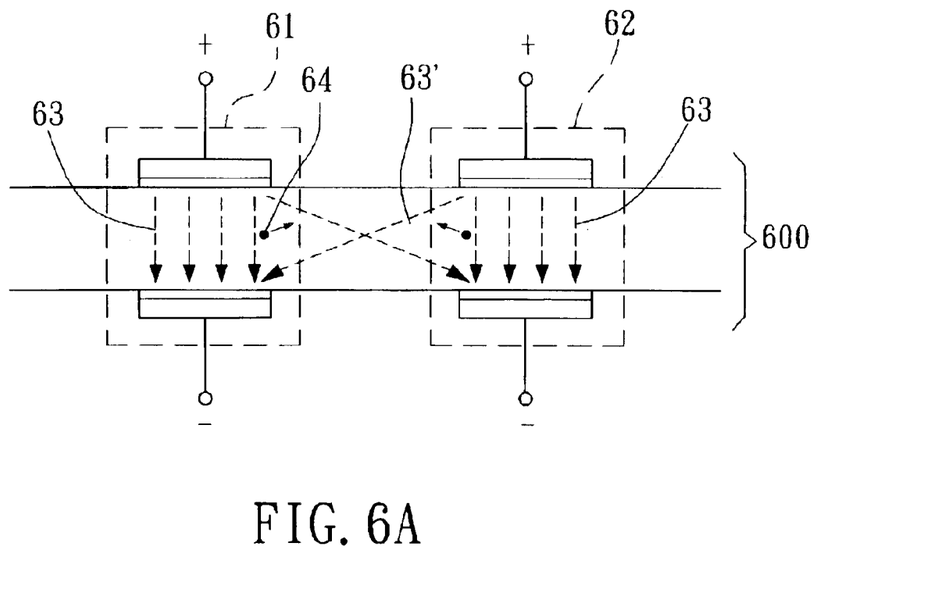
FIG. 6A to FIG. 6B show the process of forming capacitors and resistors in a core circuit board in accordance with the sixth preferred embodiment of the present invention.
Figure 6B:
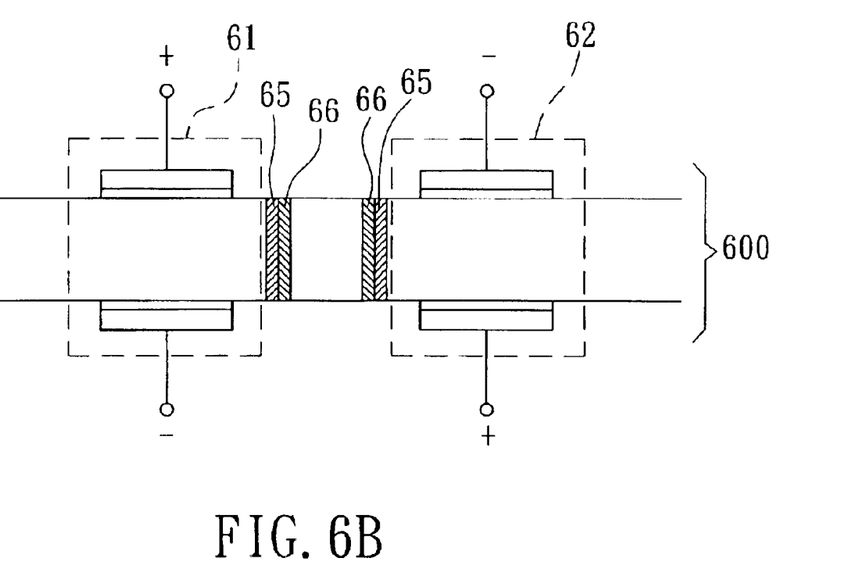

According to this invention, when any two capacitors, such as the capacitors 61, 62 shown in FIG. 6A, are located close to each other, the electric interference between them may take place. For instance, the electric field 63 is not isolated, but the extra electric field 63' may occur. Moreover, the electrons or charged ions 64 generated under said electric field 63 may drift outside of said capacitor 61 (or 62). These two effects may deteriorate the electric stability of said capacitor 61 (or 62). In order to eliminate these two effects, the insulating material and conductive material are suggested to be placed in between said two capacitor 61,62. The insulating material is used to stop the movement of said electrons or charged ions 64, while the conductive material is used to isolate the electric field 63 with any electric interference in between said capacitors 61,62. FIG. 6B is an clear illustration of the cross section of the insulating material 65 and conductive material 66 placed in between said capacitors 61,62.

Figure 7A:
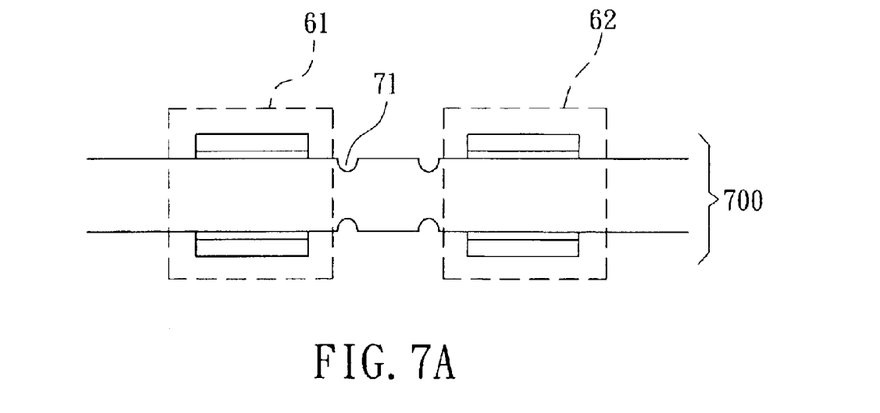
FIG. 7A to FIG. 7F show the process of forming capacitors and resistors in a core circuit board in accordance with the seventh preferred embodiment of the present invention.
Figure 7B:
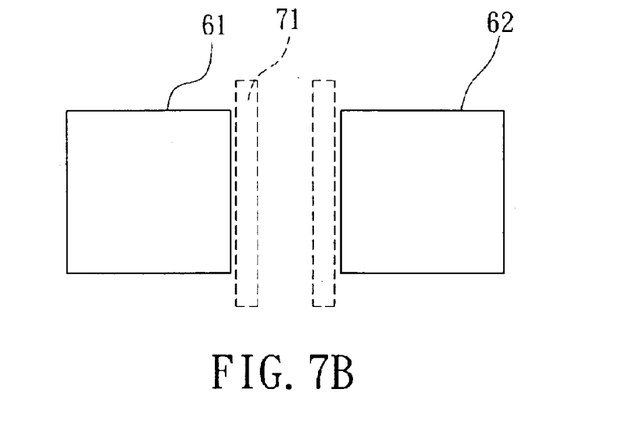
Figure 7C:
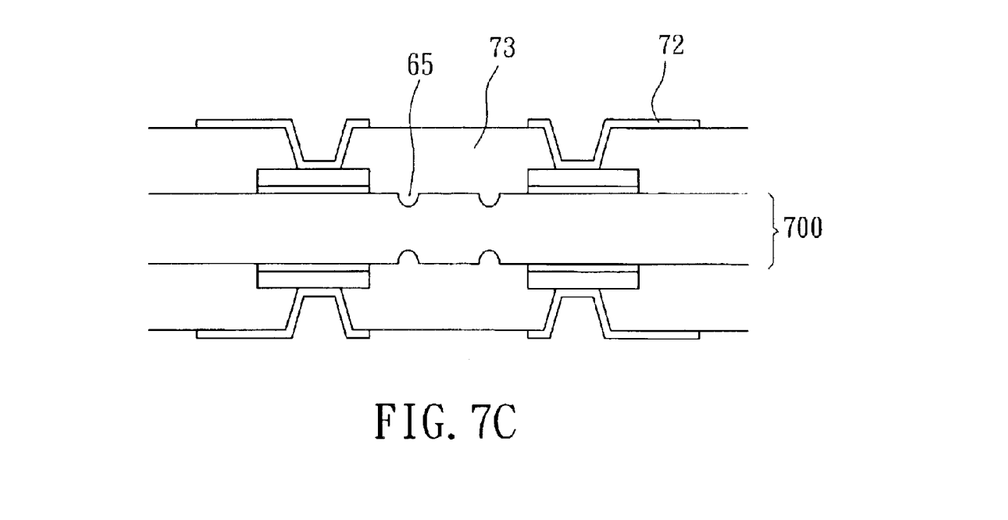
Figure 7D:
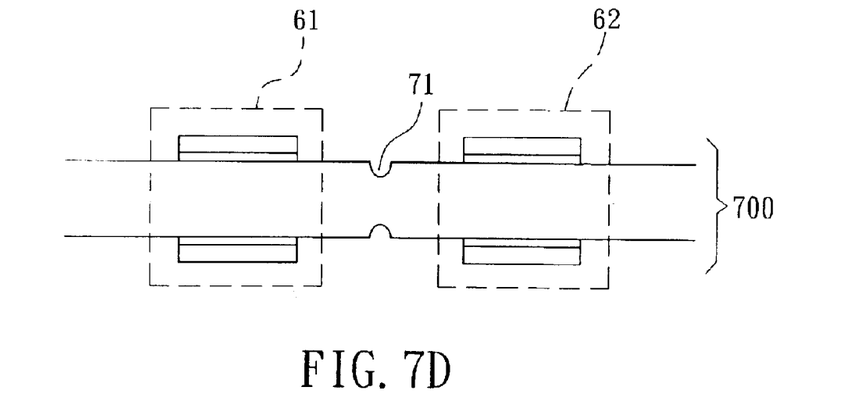

In accordance with a preferred embodiment of the present invention, said insulating material 65 can practically be replaced in between any two capacitors in a number of ways. As illustrated in FIGS. 7A (side view) and 7B (top view), four trenches 71 in between said two capacitors 61,62 may be first made by an etching method, such as plasma etching or laser milling, etc. With the build-up process, the extra circuit layer 72 is formed on the insulating layer 73, as illustrated in FIG. 7C. During the build-up process, said insulating material 65 is formed in said trenches 71 which just are filled by said insulating layer 73. However, the number of said trenches 71 is not limited to four trenches but can be any number of trenches. For instance, FIG. 7D shows an example, in which only two trenches are formed in between said two capacitors 61,62.

Figure 7E:
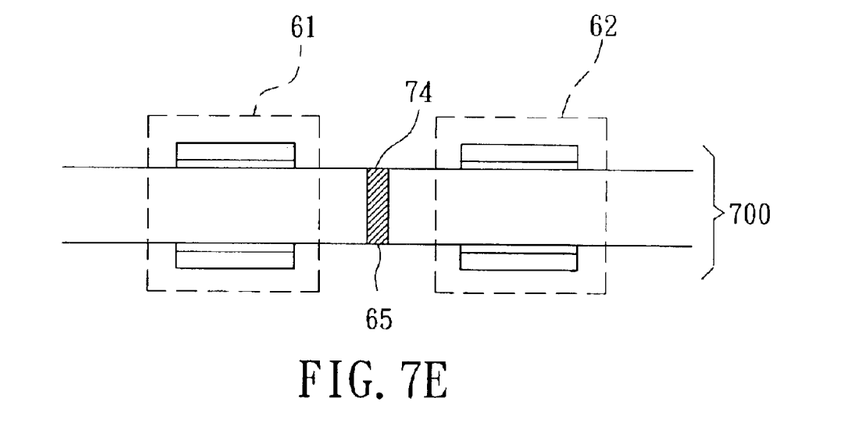
Figure 7F:
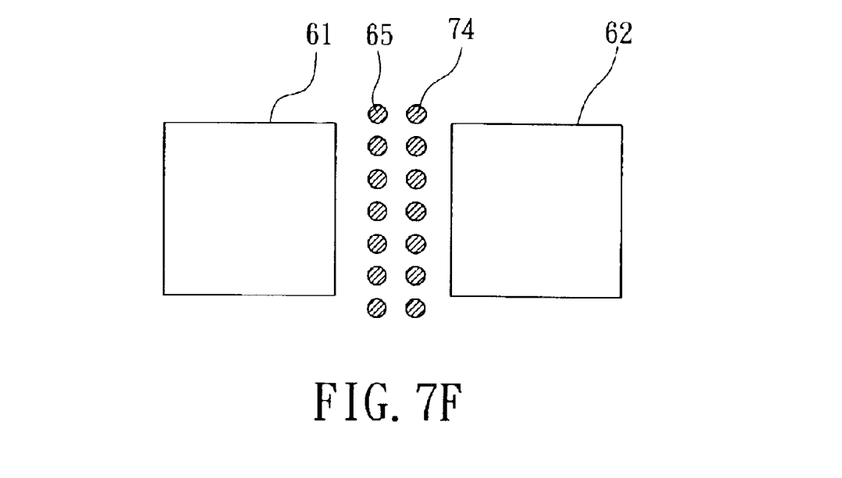

In accordance with a preferred embodiment of the present invention, said insulating material 65 also can be placed in a through-hole 74, as shown in FIG. 7E. FIG. 7F displays an array of said through-holes 74 filled with said insulating material 65 which is placed in between said capacitors 61,62.

Figure 8A:
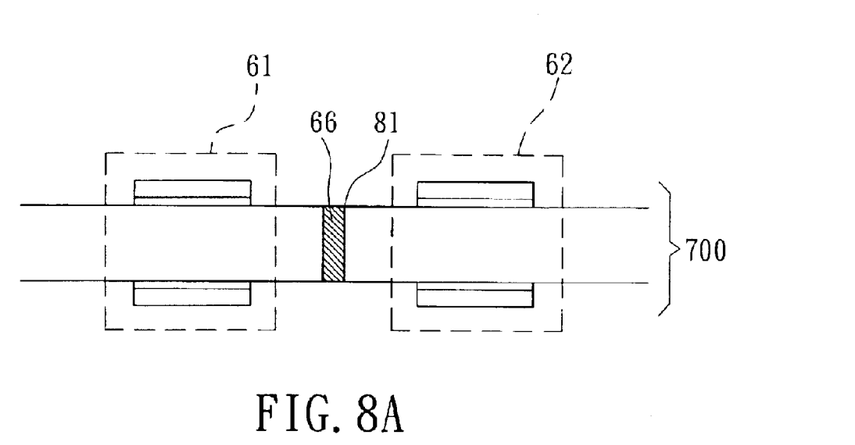
FIG. 8A to FIG. 8E show the process of forming capacitors and resistors in a core circuit board in accordance with the eighth preferred embodiment of the present invention.
Figure 8B:
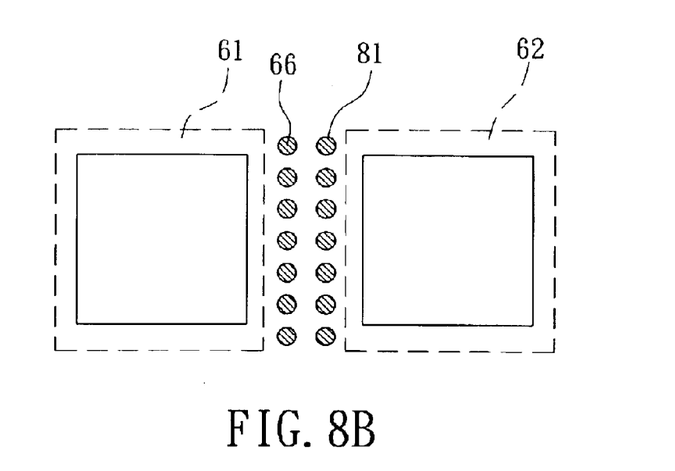
Figure 8C:
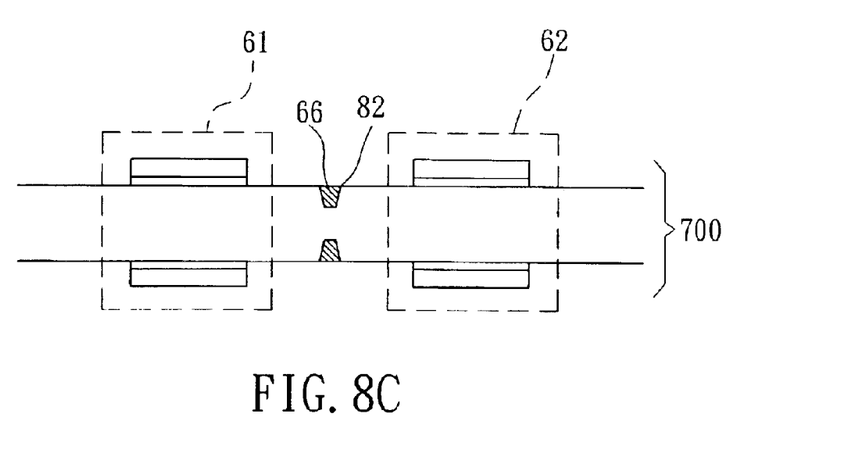
Figure 8D:
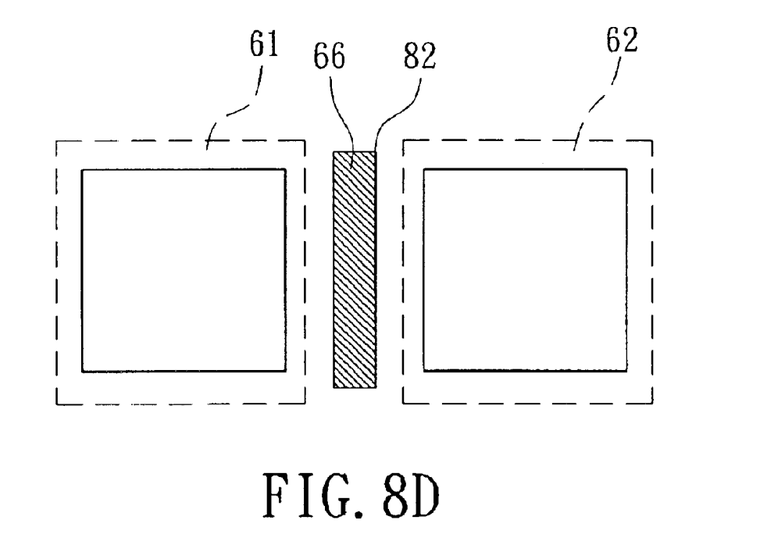
Figure 8E:
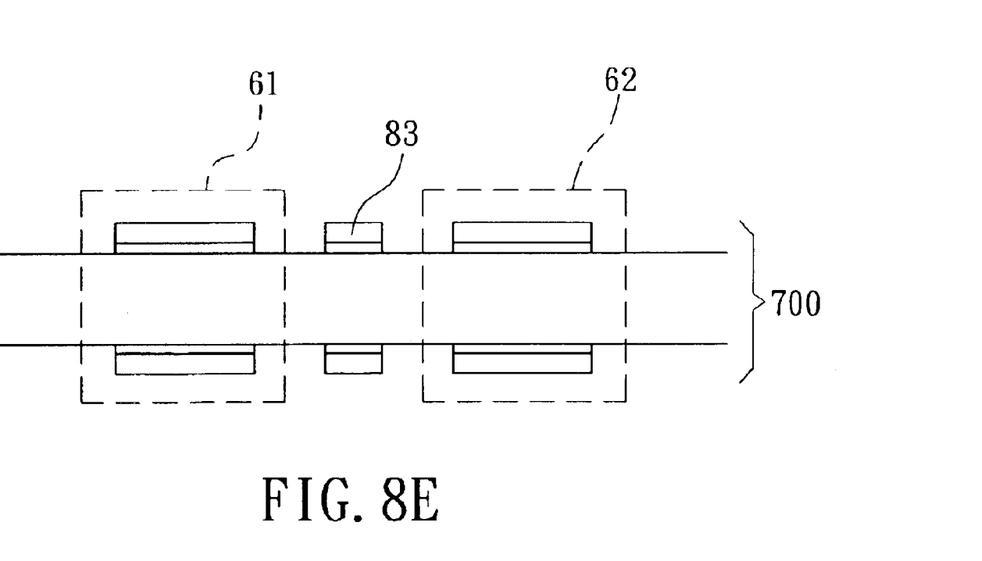

In accordance with a preferred embodiment of the present invention, said conductive material 66 can also be placed in between said capacitors 61, 62. in a number of ways. As shown in FIG. 8A, said conductive material 66 can be filled in a through-hole to form the electrically conductive through-hole 81. An array of said conductive holes 81 can be placed in between said capacitors 61,62 to eliminate the electric field interference effect, as shown in FIG. 8B. Alternatively, said conductive material 66 can be filled in the trenches 82 in between said capacitors 61,62, which is shown in FIGS. 8C (side view) and 8D (top view). However, a conductive trace 83 can also be made to run between said capacitors 61,62, which is used to reduce signal interference between said capacitor 61,62 as shown in FIG. 8E. It will be noted that conductive holes 81, conductive trenches 82 and trace 83 can be intentionally electrically connected to ground or power circuit lines for better electrical performance results.

In accordance with a preferred embodiment of the present invention, said insulating material 65 and/or conductive material 66 are limited to be placed in between any two capacitors but can also be placed in between any two passive components, such as in between a capacitor and a resistor, or in between two resistors, etc.

While novel features of the present invention have been described with reference to one or more particular embodiments herein, those skilled in the art will recognize that many modifications and variations of the present invention are possible. Therefore, the scope of the present invention should be limited only by the following claims.

What is claimed is:

1. A method of making a core circuit board for making a multilayer circuit board having embedded passive components comprising the steps of:
   providing two electrically conductive foils;
   depositing at least one resistive film on the surface of at least one of said two electrically conductive foils;
   laminating said two electrically conductive foils onto opposite sides of a high dielectric layer respectively to form a core board; and
   etching said electrically conductive foils of said core board to form electrodes of a resistor and a capacitor.

2. The method of claim 1, wherein said electrically conductive foil is made of metal selected from a group of copper, aluminum and the alloy thereof.

3. The method of claim 1, wherein the surface of said electrically conductive foil is partially covered by said resistive film.

4. The method of claim 1, wherein said resistive film is made of metal alloy selected from a group of Ni—Cr, Ni—Sn, Ni—P, Cr—Si and Ta—N alloy.

5. The method of claim 1, wherein said resistive film is made of a polymer filled with electrically conductive filler.

6. The method of claim 5, wherein said electrically conductive filler is selected from a group of electrically conductive ceramic particles and metallic particles.

7. The method of claim 1, wherein said high dielectric layer is made of a material with the dielectric constant larger than 4.0.

8. A method of making a core circuit board for making a multilayer circuit board having embedded passive components comprising the steps of:
   providing two electrically conductive foils;
   depositing at least one resistive film on the surface of at least one of said two electrically conductive foils;
   laminating said two electrically conductive foils onto opposite sides of a high dielectric layer respectively to form a core board;
   etching said electrically conductive foils of said core board to form electrodes of two capacitors; and
   depositing at least one insulating material in between said two capacitors.

9. The method of claim 8, wherein said electrically conductive foil is composed of metal selected from a group of copper, aluminum and the alloy thereof.

10. The method of claim 8, wherein the surface of said electrically conductive foil is partially covered by said resistive film.

11. The method of claim 8, wherein said resistive film is made of metal alloy selected from a group of Ni—Cr, Ni—Sn, Ni—P, Cr—Si and Ta—N alloy.

12. The method of claim 8, wherein said resistive film is made of a polymer filled with electrically conductive filler.

13. The method of claim 12, wherein said electrically conductive filler is selected from a group of electrically conductive ceramic particles and metallic particles.

14. The method of claim 8, wherein said high dielectric layer is made of material with the dielectric constant larger than 4.0.

15. The method of claim 8, said insulating material is a material selected from a group of polymeric material, polymer composite material and ceramic material.

16. A method of making a core circuit board for making a multilayer circuit board having embedded passive components comprising the steps of:
   providing two electrically conductive foils;
   depositing at least one resistive film on the surface of at least one of said two electrically conductive foils;
   laminating said two electrically conductive foils onto opposite sides of a high dielectric layer respectively to form a core board;
   etching said electrically conductive foils of said core board to form electrodes of two capacitors; and
   depositing an electrically conductive material in between said two capacitors in said high dielectric layer.

17. The method of claim 16, wherein said electrically conductive foil is composed of metal selected from a group of copper, aluminum and the alloy thereof.

18. The method of claim 16, wherein the surface of said electrically conductive foil is partially covered by said resistive film.

19. The method of claim 16, wherein said resistive film is made of metal alloy selected from a group of Ni—Cr, Ni—Sn, Ni—P, Cr—Si and Ta—N alloy.

20. The method of claim 16, wherein said resistive film is made of a polymer filled with electrically conductive filler.

21. The method of claim 20, wherein said electrically conductive filler is selected from a group of electrically conductive ceramic particles and metallic particles.

22. The method of claim 16, wherein said high dielectric layer is made of a material with the dielectric constant larger than 4.0.

\* \* \* \* \*